(12) United States Patent
Hönigschmid et al.

(10) Patent No.: US 6,657,916 B2
(45) Date of Patent: Dec. 2, 2003

(54) INTEGRATED MEMORY WITH MEMORY CELL ARRAY

(75) Inventors: Heinz Hönigschmid, Essex Jct, VT (US); Stefan Lammers, South Burlington, VT (US); Helmut Kandolf, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/054,195

(22) Filed: Jan. 22, 2002

(65) Prior Publication Data

US 2002/0116591 A1 Aug. 22, 2002

(30) Foreign Application Priority Data

Jan. 19, 2001 (DE) .......................................... 101 02 351

(51) Int. Cl.[7] ................................................. G11C 8/00
(52) U.S. Cl. ........................... 365/230.06; 365/189.09; 365/171; 365/173; 365/232
(58) Field of Search ........................ 365/230.06, 189.09, 365/171, 173, 232

(56) References Cited

U.S. PATENT DOCUMENTS

| | | | | |
|---|---|---|---|---|
| 4,449,207 A | | 5/1984 | Kung et al. .................. | 365/230 |
| 5,511,026 A | * | 4/1996 | Cleveland et al. ...... | 365/189.09 |
| 5,978,263 A | * | 11/1999 | Javanifard et al. ...... | 365/185.11 |
| 6,097,626 A | * | 8/2000 | Brug et al. .................. | 365/171 |
| 6,256,224 B1 | * | 7/2001 | Perner et al. ................ | 365/173 |

\* cited by examiner

Primary Examiner—David Nelms
Assistant Examiner—Connie C. Yoha
(74) Attorney, Agent, or Firm—Laurence A. Greenberg; Werner H. Stemer; Ralph E. Locher

(57) ABSTRACT

An integrated memory has a memory cell array with memory cells which are connected to word lines and bit lines. For the purpose of reading from or writing to one of the memory cells, a first word line can be connected to a supply circuit via a controllable first switching device and a second word line can be connected to the supply circuit via a controllable second switching device. A control circuit can drive the first switching device in dependence of an activation state of the second word line and the second switching device in dependence of an activation state of the first word line. Consequently, existing word lines that are not currently being used can be used for addressing one of the memory cells. As a result, only one wiring plane is required for the word lines.

9 Claims, 3 Drawing Sheets

FIG 3
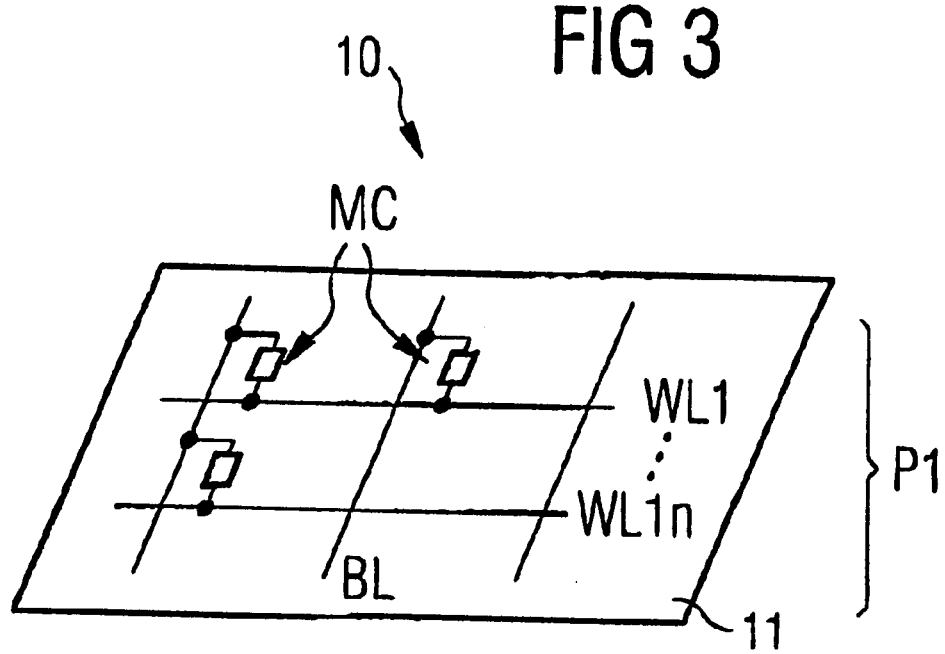
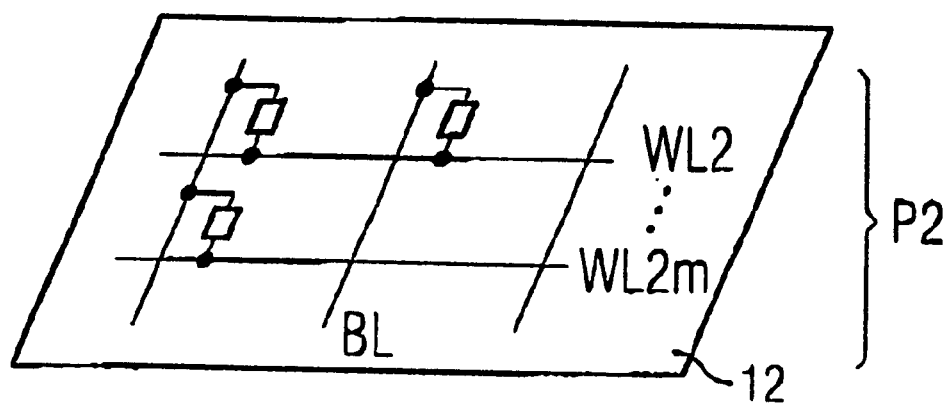
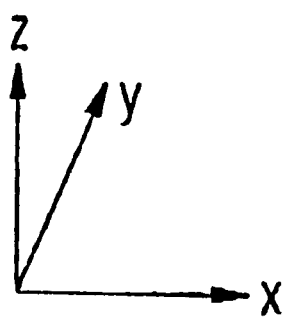

INTEGRATED MEMORY WITH MEMORY CELL ARRAY

BACKGROUND OF THE INVENTION

Field of the Invention

The invention relates to an integrated memory having a memory cell array including memory cells which are connected to word lines and bit lines. The word lines include a first and a second word line which can be connected to a row decoder for activating the word lines. The first word line can be connected to a supply circuit via a controllable first switching device and the second word line can be connected to the supply circuit via a controllable second switching device for the purpose of reading from or writing to one of the memory cells.

An integrated memory such as, for example, a so-called DRAM (Dynamic Random Access Memory) or MRAM (Magnetoresistive Random Access Memory) generally has a memory cell array which includes bit lines and word lines. In this case, the memory cells are provided at crossover points of the bit lines and word lines. The memory cells are connected to one of the bit lines and one of the word lines. In order to select one of the memory cells, the corresponding word line is activated through the use of a row decoder, as a result of which a data signal of the selected memory cell can subsequently be read out or written via the corresponding bit line.

In order to activate the word lines as rapidly as possible, they are generally constructed in two layers. In this case, each word line has first conductive structures and second conductive structures provided in respectively different wiring planes of the memory. The two different wiring planes are formed by conductive layers of the memory which are provided one above the other or one below the other. In this case, the first conductive structures are usually realized by a metal and the second conductive structures by polysilicon. While the first conductive structures are essentially embodied in an integral manner, the second conductive structures are subdivided into a plurality of segments which are isolated from one another by interruptions. Each of these segments is connected to the associated first conductive structure via a corresponding through-contact. In this case, the second conductive structures are connected to the memory cells.

During the operation of such a memory with segmented word lines, it is not necessary and desirable to drive a word line over its entire length, since this is generally associated with a relatively high power consumption and comparatively slow switching operations. In order to avoid these disadvantages, local driver stages are provided for addressing memory cells, which driver stages, in a manner dependent on an activation state of the word line or the first conductive structures thereof and in a manner dependent on an address, only connect the word line in a segment or the second conductive structures thereof to a supply circuit in the form of a voltage source or current source.

The memory concept described requires at least two wiring planes to be provided, one of which is formed by the metal plane with the integral first conductive structures. Through the latter, the local second conductive structures are connected to the respective voltage source or current source through the use of the driver stages.

SUMMARY OF THE INVENTION

It is accordingly an object of the invention to provide an integrated memory which overcomes the above-mentioned disadvantages of the heretofore-known integrated memory devices of this general type and in which a small number of required wiring planes is made possible for the word lines.

With the foregoing and other objects in view there is provided, in accordance with the invention, an integrated memory, including:

a memory cell array having word lines including a first word line and a second word line, bit lines, and memory cells connected to the word lines and the bit lines;

a row decoder for activating the word lines, the first word line and the second word line being connectable to the row decoder;

a supply circuit;

a controllable first switching device, the first word line being connectable to the supply circuit via the controllable first switching device for one of reading from and writing to one of the memory cells;

a controllable second switching device, the second word line being connectable to the supply circuit via the controllable second switching device for one of reading from and writing to one of the memory cells; and a control circuit connected to the first word line, the second word line, the controllable first switching device, and the controllable second switching device, the control circuit driving the controllable first switching device in dependence of an activation state of the second word line and driving the controllable second switching device in dependence of an activation state of the first word line.

Thus, the object of the invention is achieved through the use of an integrated memory which has a control circuit which is connected to the first and second word lines and to the first and second switching devices, in which the control circuit can drive the first switching device in a manner dependent on an activation state of the second word line and the second switching device in a manner dependent on an activation state of the first word line.

In the memory according to the invention, the switching devices of, for example, a driver circuit through the use of which the word lines are connected to a supply circuit for the purpose of reading from or writing to one of the memory cells are not controlled via an additional line in an additional metal plane, rather existing word lines are used for this purpose. Since, for a memory cell access, generally only one word line in each case is used for reading from or writing to memory cells, the other word lines can be used for a control function at this point in time. In this case, it must be ensured through the choice of activation state that when a word line is used as a control line, the content of the memory cells of this word line is not altered. This is generally achieved by the relevant word line having a different state suitable for this when it is used as a control line. By way of example, if the first word line is intended to be connected to the supply circuit for a write access, to that end the second word line is correspondingly activated by the row decoder. The first word line is correspondingly activated for the other case, in which a memory cell access is intended to be carried out via the second word line. If the memory is subdivided into a plurality of word line segments, then the concept according to the invention can be employed for each segment. Fast addressing of the respective memory cells and a low power consumption are made possible as a result.

In such an embodiment of the memory, the memory cell array has at least two word line segments, the first word line segment containing the first and second word lines and a second word line segment containing a third and fourth word line. The first and third word lines and also the second and fourth word lines are connected to one another by driver circuits. The third word line can be connected to the supply circuit via a controllable third switching device and the fourth word line can be connected to the supply circuit via a controllable fourth switching device. Each of the word line segments is assigned a control circuit which is connected to the respective word lines of the respective word line segment and the associated switching device.

According to another embodiment of the integrated memory according to the invention, the driver circuits can in each case be connected to a terminal for an address signal for activating the respective driver circuit. As a result, each word line segment can be selected through the use of a corresponding address signal. For an identical purpose, in a further embodiment, the control circuit can be connected to a terminal for an address signal for activating the control circuit.

According to another feature of the invention, an address terminal for providing an address signal is provided, and the control circuit is connectable to the address terminal in order to activate the control circuit.

The invention can be used particularly advantageously for so-called MRAM memories. The latter are often constructed similarly to, for example, integrated memories of the DRAM type. The MRAM memory cells having a magnetoresistive memory effect are in each case connected between one of the bit lines and one of the word lines. In this case, the memory cells have a higher impedance than the word lines and bit lines.

In order to write information to one of the memory cells, generally it is necessary to generate a magnetic field for the relevant memory cell which puts a magnetic layer of the memory cell into a corresponding state. This magnetic field is generated by respective currents or by superposition of the magnetic fields thereof, the currents being fed into the respective word line and bit line at a respective supply location. A supply circuit provided for this purpose has a current source connected to the respective word line and bit line.

If the memory according to the invention is embodied as an MRAM memory, then generally there is no risk that when a word line is used as a control line, the memory content of the memory cells of the word line will be altered. When used as a control line (first state), the word line is driven by a voltage source via the row decoder, as a result of which the memory content of the memory cells is not altered. By contrast, the reading out or writing of data signals is performed by driving a current (second state) through the respective line.

The invention can advantageously be used for a memory whose memory cells are provided in a plurality of memory cell arrays, the memory cell arrays being provided on the semiconductor chip in each case in planes running one above the other. For such a so-called multi-level memory, only one wiring plane has to be provided for the respective word line in each of the planes running one above the other. In comparison with the construction of a memory with two-layer word lines as described in the introduction, the effect of saving of an unnecessary additional wiring plane is manifested even more clearly here.

According to another feature of the invention, a first address terminal for providing a first address signal is provided; a second address terminal for providing a second address signal is provided; the controllable first switching device and the controllable second switching device each have a control terminal; the control circuit includes a first logic combination circuit and a second logic combination circuit; the first logic combination circuit has inputs respectively connected to the first address terminal for providing the first address signal and to the first word line; the first logic combination circuit has an output connected to the control terminal of the controllable second switching device; the second logic combination circuit has inputs respectively connected to the second address terminal for providing the second address signal and to the second word line; and the second logic combination circuit has an output connected to the control terminal of the controllable first switching device.

According to another feature of the invention, the first address terminal for providing the first address signal and the second address terminal for providing the second address signal are connected to one another.

According to yet another feature of the invention, the supply circuit includes a current source connectable to the first word line and to the second word line.

According to a further feature of the invention, a semiconductor chip region including a plurality of memory cell arrays is provided, the memory cell arrays defining respective planes, a first one of the planes extends above a second one of the planes; and the memory cells are disposed in the plurality of memory cell arrays such that the first word line is disposed in the first one of the planes and the second word line is disposed in the second one of the planes.

According to another feature of the invention, the memory cells have a magnetoresistive memory effect, and the memory cells are in each case connected between one of the bit lines and one of the word lines.

Other features which are considered as characteristic for the invention are set forth in the appended claims.

Although the invention is illustrated and described herein as embodied in an integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is schematic perspective view of an integrated memory with memory cell arrays in a stacked configuration.

DESCRIPTION OF THE PREFERRED EMBODIMENTS

Figure 1:
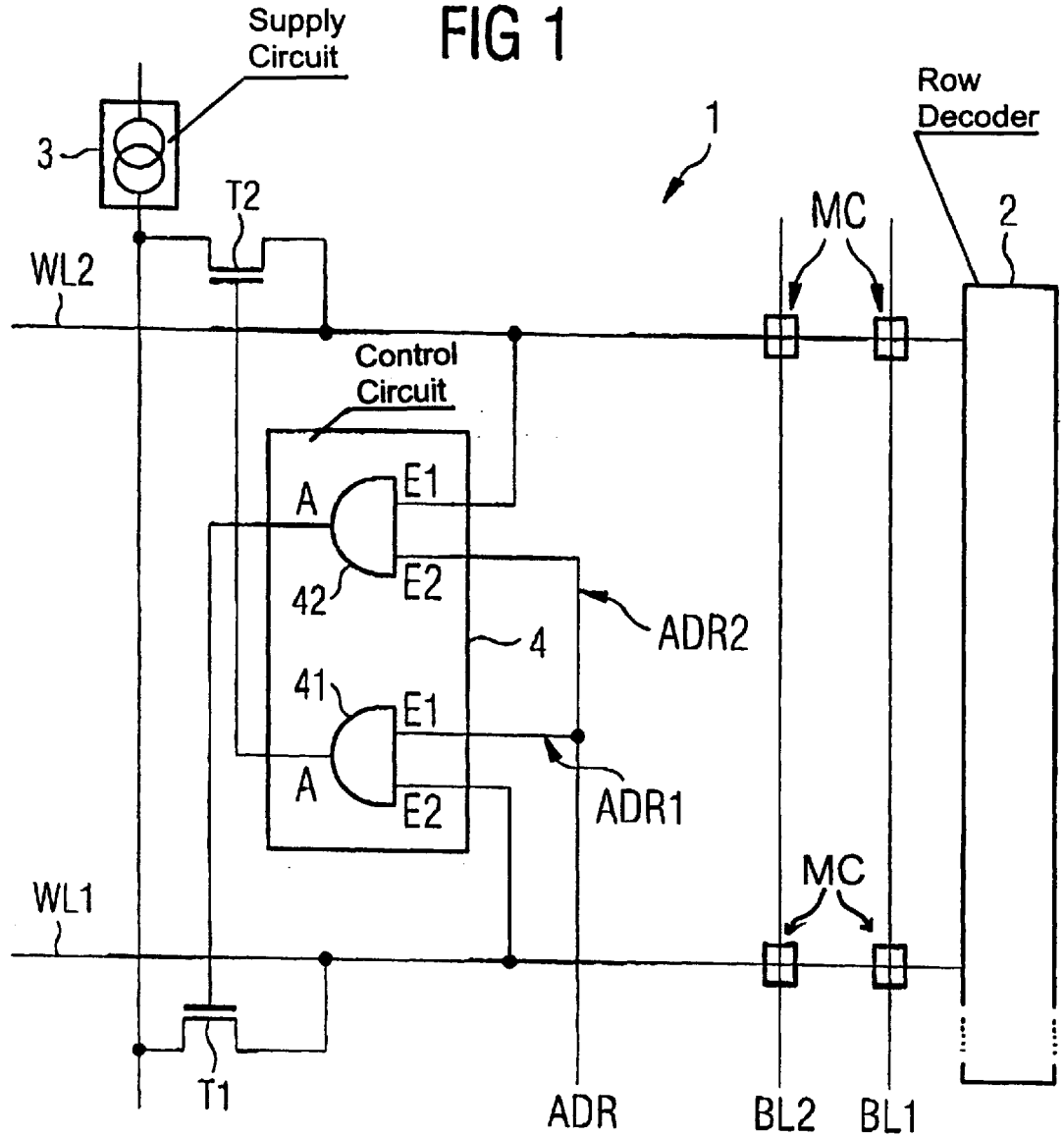
FIG. 1 is a circuit diagram of an embodiment of an integrated memory according to the invention.

Referring now to the figures of the drawings in detail and first, particularly, to FIG. 1 thereof, there is shown an embodiment of an MRAM memory having memory cells with a magnetoresistive memory effect. All known GMR/TMR (Giant Magneto-Resistive/Tunnel Magneto-Resistive) elements are suitable as memory cells provided that they have a higher impedance than the word lines and bit lines. The memory cells MC, which are provided in a memory cell array 1, are in each case connected to one of the word lines WL1, WL2 and to one of the bit lines BL1, BL2 and provided at crossover points. The memory here has an exemplary number of word lines and bit lines. The word lines WL1 and WL2 are preferably provided adjacent to one another.

In order to write an information item or a data signal to one of the memory cells MC, the corresponding connected word line WL1, WL2 is connected via a respective switch T1 and T2 to the supply circuit 3 in the form of a current source. The currents flowing in the corresponding lines generate a superposed magnetic field at the crossover point at which the relevant memory cell MC is provided, which magnetic field puts a magnetic layer of the relevant memory cell into a specific state.

The word lines WL1 and WL2 are furthermore connected to a row decoder 2 for activating the word lines. They are additionally connected to a control circuit 4 which, for its part, is connected to the switches T1 and T2. For activation of the control circuit 4, the latter is connected to a terminal for an address signal ADR.

The control circuit 4 has a first logic combination circuit in the form of an AND gate 41, whose inputs E1 and E2 are connected to a terminal for a first address signal ADR1 and to the word line WL1. The output A is connected to the control terminal of the switch T2. The control circuit 4 additionally contains a second logic combination circuit 42 likewise in the form of an AND gate, whose inputs E1 and E2 are connected to a terminal for a second address signal ADR2 and to the word line WL2. The output A is connected to the control terminal of the switch T1. In the embodiment in accordance with FIG. 1, the terminals for the address signals ADR1 and ADR2 are connected to one another. In another embodiment, it is conceivable for the logic combination circuits 41 and 42 to be driven by a separate address signal in each case.

A write operation via the word line WL2 is briefly explained below.

The word line WL1 is used for controlling the write operation since this word line itself is not used for a write operation at this point in time. The word line WL1 is put into the state H, which denotes an active state and corresponds for example to a positive supply potential of the memory. The signal ADR is likewise put into the state H. As a result, the transistor T2 is turned on and the word line WL2 is connected to the current source 3 for driving a write current.

In accordance with the circuit according to FIG. 1, care must be taken to ensure that, with switch T2 switched on, for example, the voltage at the input E1 of the gate 42 remains below the respective switching threshold, since otherwise the switch T1 is likewise switched on. As a result, a write access would likewise be made to the word line WL1 which functions as a control line at this point in time. Opening of the switch T1 is prevented in this case for example by the provision of an n-channel transistor with a high threshold voltage at the input E1 of the gate 42. During the writing process via the word line WL2, generally comparatively low voltages occur, so that the gate 42 does not switch through. The same applies to the input E2 of the gate 41, as a result of which opening of the switch T2 is prevented if writing is effected via the word line WL1 and the word line WL2 is used for control.

Figure 2:
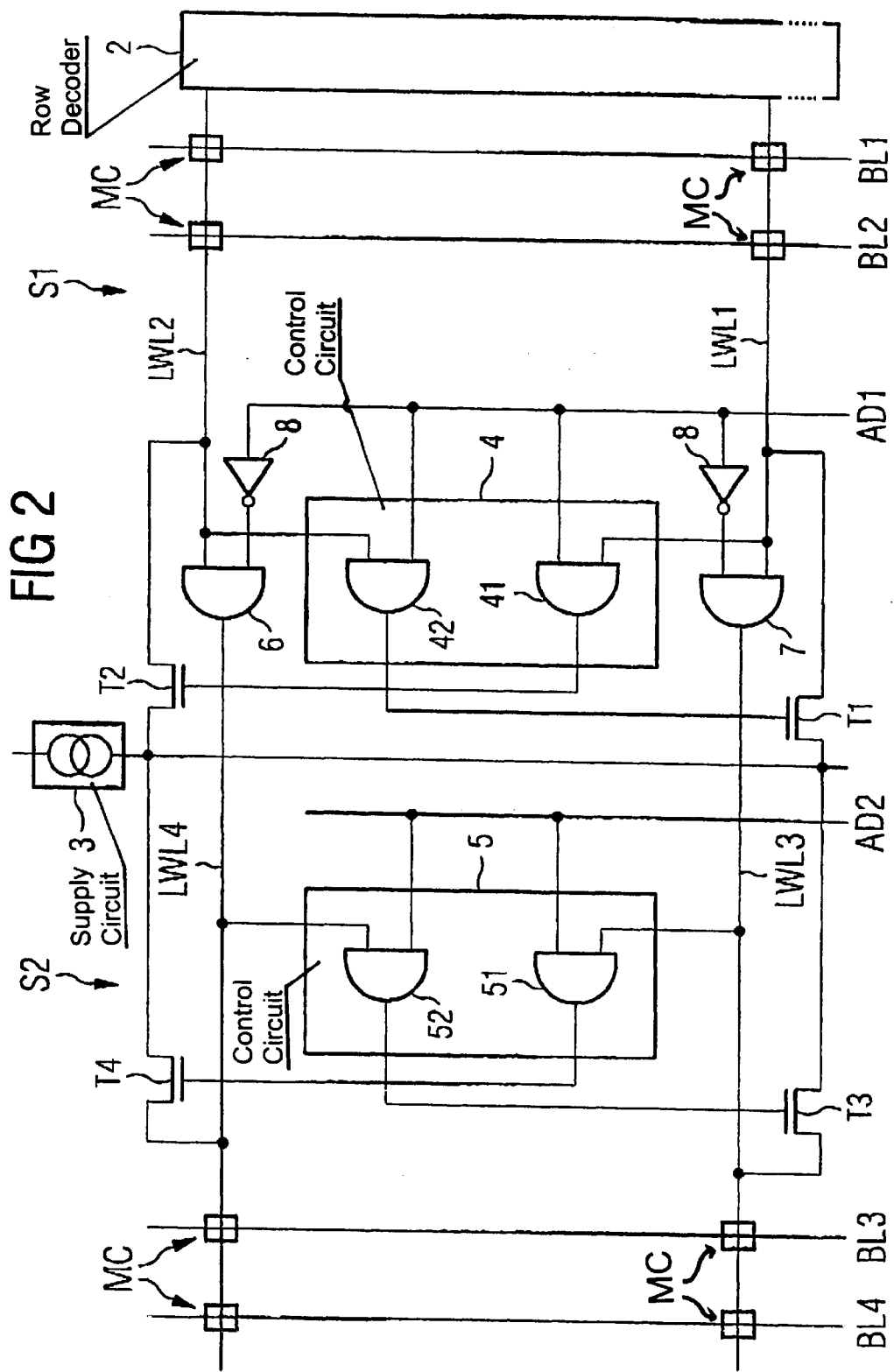
FIG. 2 is a circuit diagram of a further embodiment of an integrated memory according to the invention.

FIG. 2 illustrates a further embodiment of an integrated memory according to the invention. The memory cell array is subdivided into two word line segments S1 and S2. In this case, the construction of the memory in the word line segment S1 essentially corresponds to the construction in accordance with FIG. 1. In contrast thereto, the word lines WL1 and WL2 from FIG. 1 are embodied as local word lines LWL1, LWL2. The second word line segment S2 has the further local word lines LWL3 and LWL4. The word lines LWL2 and LWL4 and also the word lines LWL1 and LWL3 are in each case connected to one another by driver circuits 6 and 7 (AND gates). The latter are driven by a first address signal AD1 via respective inverters 8. The word line LWL3 can be connected to the current source 3 via a switch T3 and the word line LWL4 can be connected to the current source 3 via a switch T4. The word line segment S2 has a control circuit 5, which has a construction analogous to that of the control circuit 4. Accordingly, the switch T4 is driven in a manner dependent on an activation state of the word line LWL3 via the gate 51. Accordingly, the switch T3 can be driven in a manner dependent on an activation state of the word line LWL4 via the gate 52. The memory cells MC in the word line segment S2 are provided at crossover points of the bit lines BL3 and BL4 with the word lines LWL3 and LWL4 and connected to these.

The method of operation of the circuit illustrated in FIG. 2 is briefly explained below.

For the case where the word lines LWL1 and LWL2 are accessed for a write operation, the address signal AD1 is in an activated state H. As a result, the driver circuits 6 and 7 are not activated. In this case, the method of operation of the circuit in the word line segment S1 corresponds to the circuit configuration in accordance with FIG. 1. The word lines LWL3 and LWL4 are inactivated.

For the case where the address signal AD1 is in the non-activated state (state L, for example reference-ground potential), whereas the word line LWL1 is in the activated state H, the word line LWL2 is not selected. The signal on the word line LWL1 is forwarded via the driver circuit 7 to the word line LWL3, where a new signal comparison is carried out. For the case where the address signal AD2 is in the active state H, the switch T4 is activated and the word line LWL4 is connected to the current source 3.

FIG. 3 is a simplified diagrammatic view of a configuration of an MRAM memory having memory cell arrays in a stacked configuration. The memory cell arrays 11 and 12 are provided on the semiconductor chip 10 in each case in planes P1 and P2 running one above the other. The memory cells MC are in each case connected between one of the bit lines B1 and one of the word lines WL1 to WL1n and WL2 to WL2m, respectively. In this case, the memory cell arrays 11 and 12 extend in the x-direction and y-direction of a system of Cartesian coordinates; they are stacked one above the other in the z-direction of the coordinate system, the z-direction being perpendicular to the x- and y-directions.

The memory cell arrays 11 and 12 have a circuit construction that is fundamentally identical to that illustrated in FIG. 1. However, the word lines WL1 and WL2 in accordance with FIG. 1 are provided in different planes. In this case, the gates 41 and 42 in accordance with FIG. 1 are not driven by the same signal ADR. Since the gates are then fed in each case separate address signals ADR1 and ADR2, in the gates 41 and 42 it is possible to dispense with the provision of transistors with a high threshold voltage at the inputs.

We claim:

1. An integrated memory, comprising:
   a memory cell array having word lines including a first word line and a second word line, bit lines, and memory cells connected to said word lines and said bit lines;
   a row decoder for activating said word lines, said first word line and said second word line being connectable to said row decoder;

a supply circuit;

a controllable first switching device, said first word line being connectable to said supply circuit via said controllable first switching device for one of reading from and writing to one of said memory cells;

a controllable second switching device, said second word line being connectable to said supply circuit via said controllable second switching device for one of reading from and writing to one of said memory cells; and a control circuit connected to said first word line, said second word line, said controllable first switching device, and said controllable second switching device, said control circuit driving said controllable first switching device in dependence on a control activation state of a second word line input to said control circuit and driving said controllable second switching device in dependence on a control activation state of a first word line input to said control circuit.

2. The integrated memory according to claim 1, wherein:

said memory cell array has at least two word line segments, said at least two word line segments include a first word line segment and a second word line segment;

said first word line segment includes said first word line and said second word line;

said second word line segment includes a third word line and a fourth word line;

driver circuits respectively connecting said first word line and said third word line to one another and connecting said second word line and said fourth word line to one another;

a controllable third switching device, said third word line being connectable to said supply circuit via said controllable third switching device;

a controllable fourth switching device, said fourth word line being connectable to said supply circuit via said controllable fourth switching device; and a further control circuit, said first word line segment being assigned to said control circuit, said second word line segment being assigned to said further control circuit, said control circuit and said further control circuit being connected to associated ones of said first, second, third, and fourth word lines of a respective one of said first and second word line segments and to associated ones of said controllable first, second, third, and fourth switching devices.

3. The integrated memory according to claim 2, including:

address terminals for providing an address signal; and said driver circuits being connectable to a respective one of said address terminals in order to activate a respective one of said driver circuits.

4. The integrated memory according to claim 1, including:

an address terminal for providing an address signal; and said control circuit being connectable to said address terminal in order to activate said control circuit.

5. The integrated memory according to claim 1, including:

a first address terminal for providing a first address signal;

a second address terminal for providing a second address signal;

said controllable first switching device and said controllable second switching device each having a control terminal;

said control circuit including a first logic combination circuit and a second logic combination circuit;

said first logic combination circuit having inputs respectively connected to said first address terminal for providing the first address signal and to said first word line;

said first logic combination circuit having an output connected to said control terminal of said controllable second switching device;

said second logic combination circuit having inputs respectively connected to said second address terminal for providing the second address signal and to said second word line; and said second logic combination circuit having an output connected to said control terminal of said controllable first switching device.

6. The integrated memory according to claim 5, wherein said first address terminal for providing the first address signal and said second address terminal for providing the second address signal are connected to one another.

7. The integrated memory according to claim 1, wherein said supply circuit includes a current source connectable to said first word line and to said second word line.

8. The integrated memory according to claim 1, including:

a semiconductor chip region including a plurality of memory cell arrays, said memory cell arrays defining respective planes, a first one of the planes extending above a second one of the planes; and said memory cells being disposed in said plurality of memory cell arrays such that said first word line is disposed in the first one of the planes and said second word line is disposed in the second one of the planes.

9. The integrated memory according to claim 1, wherein said memory cells have a magnetoresistive memory effect, and said memory cells are in each case connected between one of said bit lines and one of said word lines.

* * * * *